(12) United States Patent
Gubbins et al.

(10) Patent No.: US 7,969,772 B2
(45) Date of Patent: Jun. 28, 2011

(54) MAGNETIC MECHANICAL SWITCH

(75) Inventors: Mark Anthony Gubbins, Letterkenny (IE); Robert William Lamberton, Limavady (IE); Dadi Setiadi, Edina, MN (US)

(73) Assignee: Seagate Technology LLC, Scotts Valley, CA (US)

( * ) Notice: Subject to any disclaimer, the term of this patent is extended or adjusted under 35 U.S.C. 154(b) by 421 days.

(21) Appl. No.: 12/272,919

(22) Filed: Nov. 18, 2008

(65) Prior Publication Data

US 2010/0123534 A1  May 20, 2010

(51) Int. Cl.
*G11C 11/50* (2006.01)
(52) U.S. Cl. ............ 365/164; 200/181; 335/79; 365/171
(58) Field of Classification Search .................. 200/181; 335/79; 365/164, 171
See application file for complete search history.

(56) References Cited

U.S. PATENT DOCUMENTS

| | | | | |
|---|---|---|---|---|
| 4,746,886 | A * | 5/1988 | Uetsuhara | 335/230 |
| 5,434,549 | A * | 7/1995 | Hirabayashi et al. | 335/229 |
| 5,677,823 | A * | 10/1997 | Smith | 361/234 |
| 6,509,605 | B1 * | 1/2003 | Smith | 257/316 |
| 7,113,426 | B2 | 9/2006 | Rueckes et al. | |
| 7,253,710 | B2 | 8/2007 | Shen et al. | |
| 7,456,482 | B2 * | 11/2008 | Busta et al. | 257/415 |
| 7,745,747 | B2 * | 6/2010 | Carmona et al. | 200/181 |
| 2008/0093686 | A1 | 4/2008 | Yun et al. | |
| 2009/0072934 | A1 * | 3/2009 | Cartier Millon et al. | 335/185 |

* cited by examiner

*Primary Examiner* — Alexander Sofocleous
(74) *Attorney, Agent, or Firm* — Fellers, Snider, et al.

(57) ABSTRACT

A method and apparatus for managing data, particularly in regard to non-volatile memory cells. In some embodiments, at least two actuating conductors are at least partially surrounded by a main ferromagnetic core and an adjacent hard magnet. When current is conducted through the actuating conductors, a flexible beam is induced to traverse a first air gap that defines a high resistance position and a low resistance position.

20 Claims, 7 Drawing Sheets

MAGNETIC MECHANICAL SWITCH

BACKGROUND

Bi-stable switches as applied in data storage devices generally operate to store and retrieve data in a reliable and efficient manner. Some storage devices utilize a semiconductor array of solid-state memory cells to store individual bits of data. Such memory cells can be volatile (e.g., DRAM, SRAM) or non-volatile (RRAM, STRAM, flash, etc.).

As will be appreciated, volatile memory cells generally retain data stored in memory only so long as operational power continues to be supplied to the device, while non-volatile memory cells generally retain data storage in memory even in the absence of the application of operational power.

In these and other types of bi-stable switches, it is often desirable to increase efficiency and accuracy while decreasing power consumption during operation, particularly with regard to the management of data in a storage array.

SUMMARY

Various embodiments of the present invention are generally directed to a method and apparatus for managing data, particularly in regard to non-volatile memory cell.

In accordance with various embodiments, at least two actuating conductors are at least partially surrounded by a main ferromagnetic core and adjacent to a hard magnet. The actuating conductors induce a flexible beam to traverse a first air gap through the conduction of current in a common direction.

In other embodiments, the first air gap defines a high resistance position and a low resistance position. The low resistance position allows power to pass from one side of the main ferromagnetic core to the opposing side through a portion of the flexible beam.

These and various other features and advantages which characterize the various embodiments of the present invention can be understood in view of the following detailed discussion and the accompanying drawings.

DETAILED DESCRIPTION

Figures 1, 2:
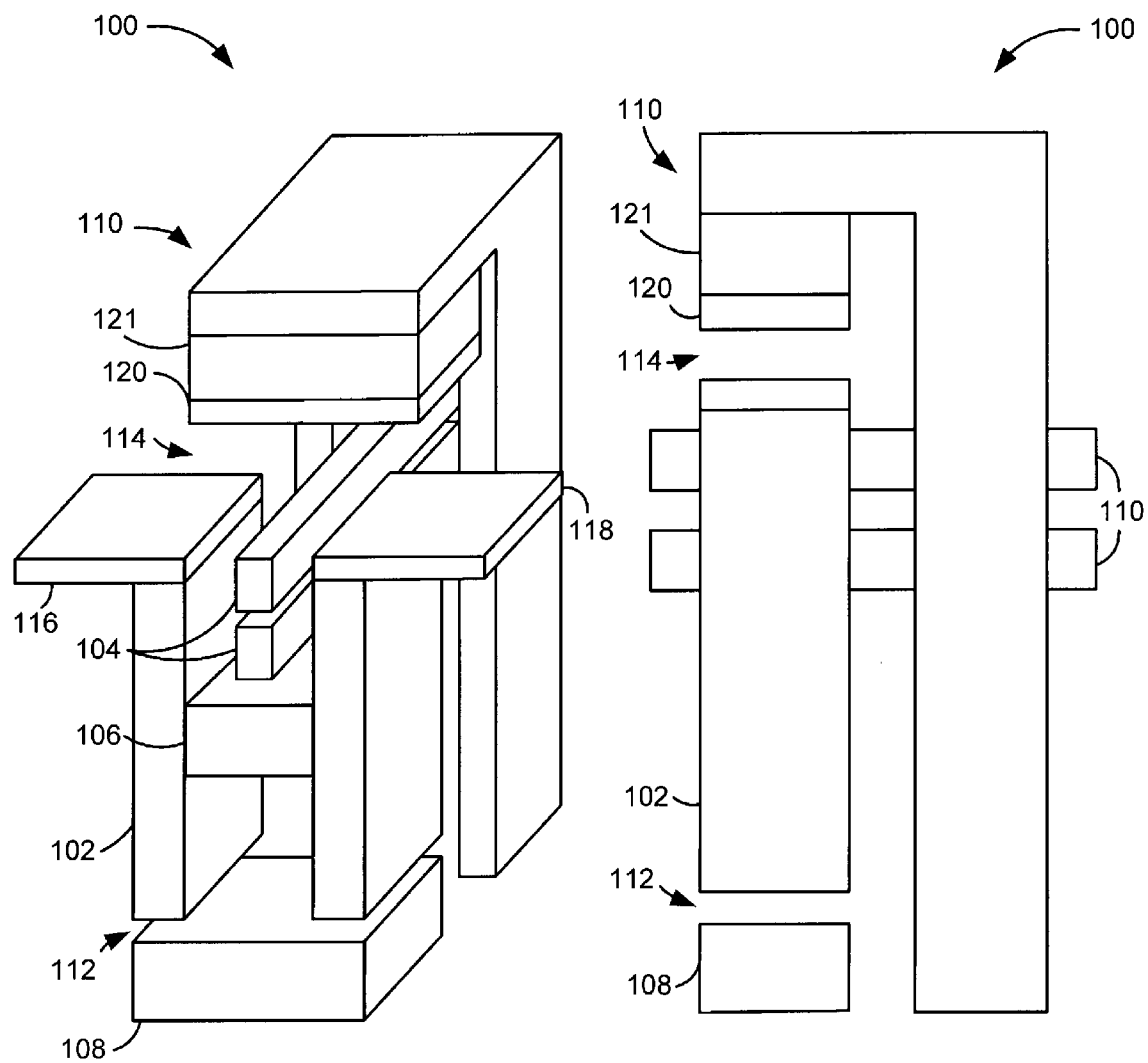
FIG. 1 is a generalized functional representation of an exemplary magnetic mechanical switch device constructed and operated in accordance with various embodiments of the present invention.
FIG. 2 shows an exemplary magnetic mechanical switch device constructed and operated in accordance with various embodiments of the present invention.

FIGS. 1 and 2 generally illustrate various views of a magnetic mechanical switch 100. In various embodiments, the magnetic mechanical switch 100 comprises a main ferromagnetic core 102 that at least partially surrounds at least a pair of actuation conductors 104 and a hard magnet 106. It can be appreciated that the actuating conductors 104 can be independent row and column lines for use in an array of switches. The hard magnet 106 is shown positioned substantially at the midpoint of the main ferromagnetic core 102 between a lower ferromagnetic core 108 and a flexible beam 110. The lower ferromagnetic core 108 is adjacent to the main ferromagnetic core 102 but separated by a second air gap 112.

The lower ferromagnetic core 108 can be a material of greater ferromagnetic properties than the main ferromagnetic core 102. Any increase in magnetic flux experienced by the magnetic mechanical switch 100 can be tuned and adjusted for ideal operation through the size of the second air gap 112.

A first air gap 114 separates the main ferromagnetic core 102 from the flexible beam 110 when the switch 100 is in a high resistance position. An upper ferromagnetic core 121 is part of the flexible beam 110 and coupled to the beam conductor 120. The high resistance position is in contrast to the low resistance position in which a portion of the flexible beam 110 is coupled to an input socket 116 and an output socket 118 through the beam conductor 120. Thus, the existence of the first air gap 114 defines the difference between the low resistance position and the high resistance position. In some embodiments, the portion of the flexible beam 110 that couples to both the input and output sockets 116 and 118 is the beam conductor 120.

Figure 3:
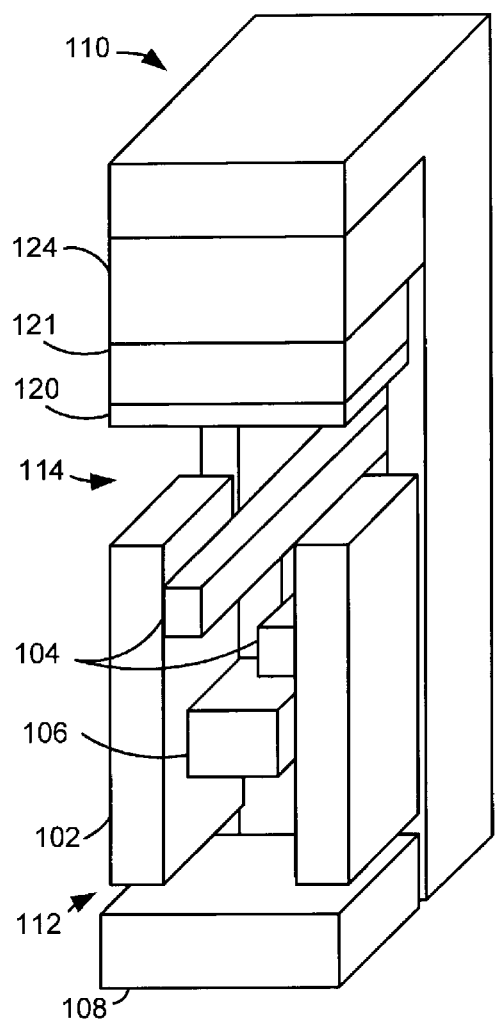
FIG. 3 displays an alternative embodiment of an exemplary magnetic mechanical switch device constructed and operated in accordance with various embodiments of the present invention.

An alternative magnetic mechanical switch 122 is displayed in FIG. 3. A main ferromagnetic core 102 at least partially surrounds a pair of actuating conductors 104 and a hard magnet 106. The actuating conductors are positioned adjacent to opposing sides of the main ferromagnetic core 102 to facilitate simpler manufacturing procedures by eliminating the need for the input and output sockets 116 and 118 for resistance sensing. Further in some embodiments, the hard magnet 106 is positioned substantially at the midpoint of the main ferromagnetic core 102 between the lower ferromagnetic core 108 and the flexible beam 110. In addition, air gaps separate the main ferromagnetic core 102 from the lower ferromagnetic core 108 and the flexible beam 110.

Figure 4:
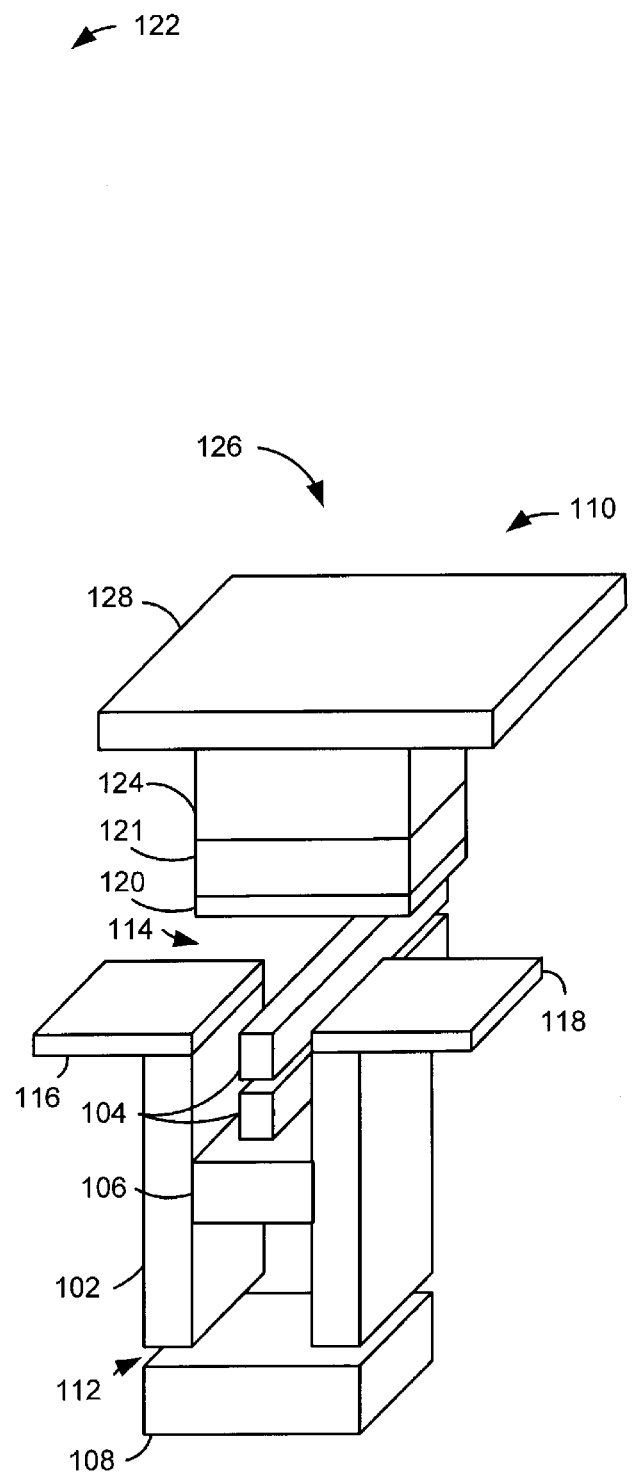
FIG. 4 shows an alternative embodiment of an exemplary magnetic mechanical switch device constructed and operated in accordance with various embodiments of the present invention.

Alternatively, the flexible beam 110 can comprise a polymeric spring 124 connected to a mechanical support 128 that exhibits spring-like properties allowing the beam conductor 120 to traverse the first air gap 114 to couple to the input and output sockets 116 and 118 and create a low resistance position, as shown in FIG. 4. The polymeric spring 124 can be positioned in various locations on the mechanical support 128, but does not necessarily require the beam to move for the beam conductor 120 to traverse the first air gap 114. In other words, the flexible beam 110 can comprise a rigid structure such as, but not limited to, a mechanical support 128 when a polymeric spring 124 is employed as the movement enabling component of the switch 126.

Further in some embodiments, the mechanical support 128 extends to numerous memory cells 100 and positions a plurality of individual polymeric springs 124 along a given row or column. The mechanical support 128 can be a variety of shapes and sizes that accommodate the attachment of a polymeric spring 124 and the operation of the switch 126 to open and close the first air gap 114 and switch between a high resistance state and a low resistance state.

Figure 5:
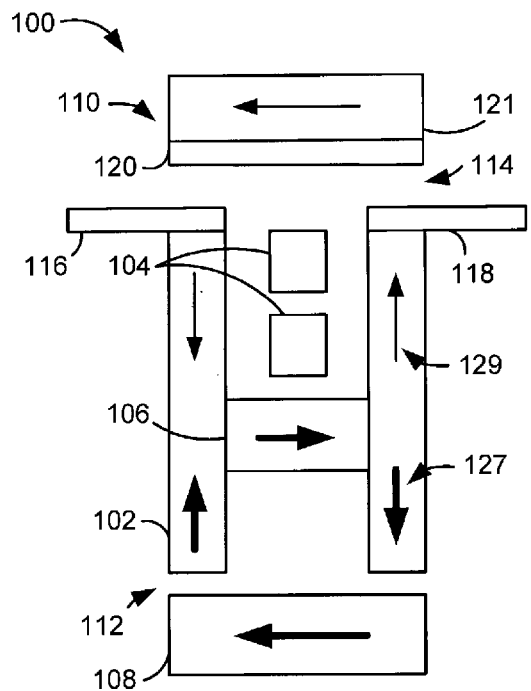
FIG. 5 generally illustrates a functional diagram of the operation of a magnetic mechanical switch device operated in accordance with the various embodiments of the present invention.

The magnetic flux associated with the various components of the magnetic mechanical switch 100 operated in accordance with the various embodiments of the present invention is shown in FIG. 5. A high resistance position is displayed in conjunction with no current being applied to either of the actuating conductors 104. When no current passes through the actuating conductors 104, two magnetic fluxes 127 and 129 are present that rotate in opposing directions. A stronger first flux 127 exists in the clockwise direction due to the large first air gap 114 and the increased ferromagnetic properties of the lower ferromagnetic core 108. The strong magnetic field flows from the hard magnet 106 through one side of the main ferromagnetic core 102 through the lower ferromagnetic core 108 and up the opposing side of the main ferromagnetic core to complete a clockwise cycle.

In contrast, the weaker second magnetic flux 129 rotates in a counter-clockwise fashion that extends from the hard magnet 106 across the first air gap 114 to the upper ferromagnetic core 121 of the flexible beam 110. The lower density magnetic field continues across the first air gap 114 through the main ferromagnetic core 102 to return to the hard magnet 106.

Figure 6:
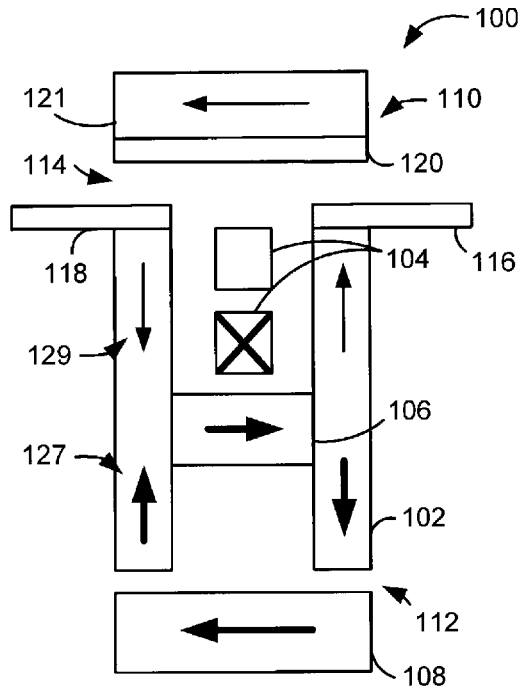
FIG. 6 displays a functional diagram of the operation of a magnetic mechanical switch device operated in accordance with the various embodiments of the present invention.

FIG. 6 shows the magnetic flux associated with the various components of the magnetic mechanical switch 100. The flux induced from the hard magnet 106 does not significantly change when current flows through only one actuating conductor 104 in either direction. A pair of rotating fluxes 127 and 129 are experienced by the various components of the magnetic mechanical switch 100 that rotate in opposing directions in a similar fashion as illustrated in FIG. 4. A weaker second flux 129 flows from the hard magnet 106 through the upper ferromagnetic core 121 of flexible beam 110 and back to the hard magnet 106 after crossing the first air gap 114 for the second time. While the counter-clockwise weaker magnetic field is not enough to induce the flexible beam 110 to traverse the first air gap 114, the magnetic density is larger than if no current is present in an actuating conductor 104.

A clockwise magnetic field of strong density is experienced by the lower ferromagnetic core 108 as the clockwise magnetic first flux 127 flows simultaneously with the weaker counter-clockwise rotating field.

Figure 7:
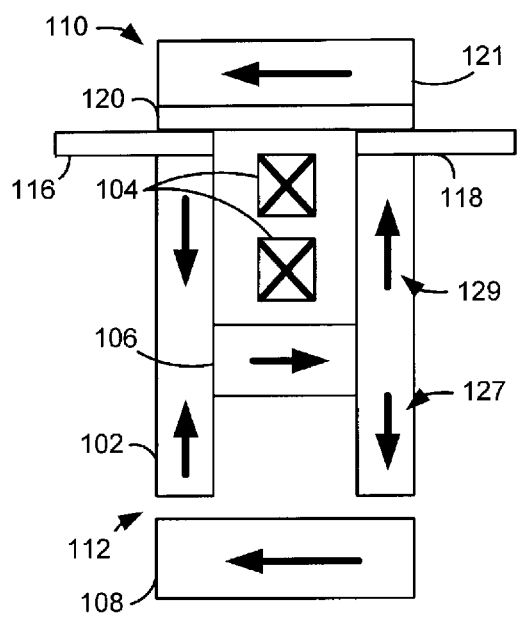
FIG. 7 shows a functional diagram of the operation of a magnetic mechanical switch device operated in accordance with the various embodiments of the present invention.

The magnetic mechanical switch 100 in a low resistance position is displayed in FIG. 7. When both actuating conductors 104 are activated with current, the counter-clockwise magnetic second flux 129 is strengthened enough to induce the flexible beam 110 to traverse the first air gap 114 and couple the beam conductor 120 with the input and output conductors 116 and 118. A clockwise magnetic first flux 127 remains present in the lower ferromagnetic core 108, but the density of the field is not enough to overcome the strength of the counter-clockwise flux. It should be noted that before and after the flexible beam 110 traverses the first air gap 114, the switch is stable. That is, no power is needed to maintain the position of the flexible beam 110. Once the flexible beam 110 is coupled to the input and output sockets and power is turned off, the magnetic power of the hard magnet 106 is enough to complete a counter-clockwise field that maintains the flexible beam in its position.

Figure 8:
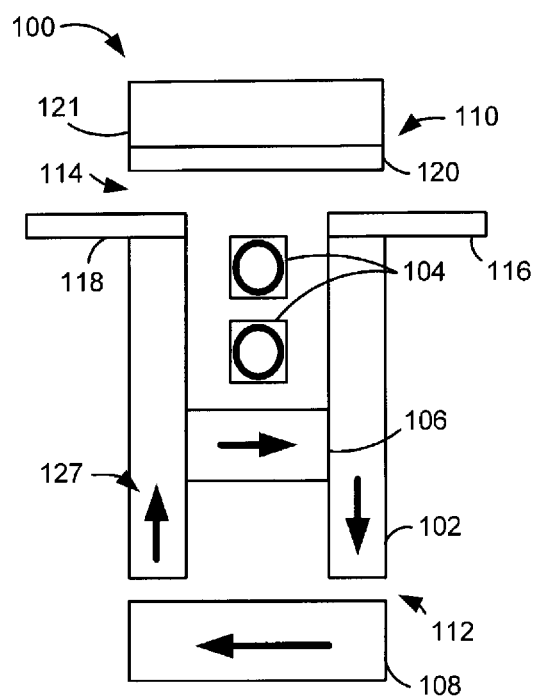
FIG. 8 generally illustrates a functional diagram of the operation of a magnetic mechanical switch device operated in accordance with the various embodiments of the present invention.

FIG. 8 shows the magnetic mechanical switch 100 operated in accordance with the various embodiments of the present invention. As current flows through the actuating conductors 104 in a direction opposite to the direction used to close the first air gap 114, a negligible counter-clockwise rotating first flux 127 exists and the flexible beam 110 is released to return to its original position. A strong clockwise magnetic field remains present flowing from the hard magnet 106 through the lower ferromagnetic core 108.

Figure 9:
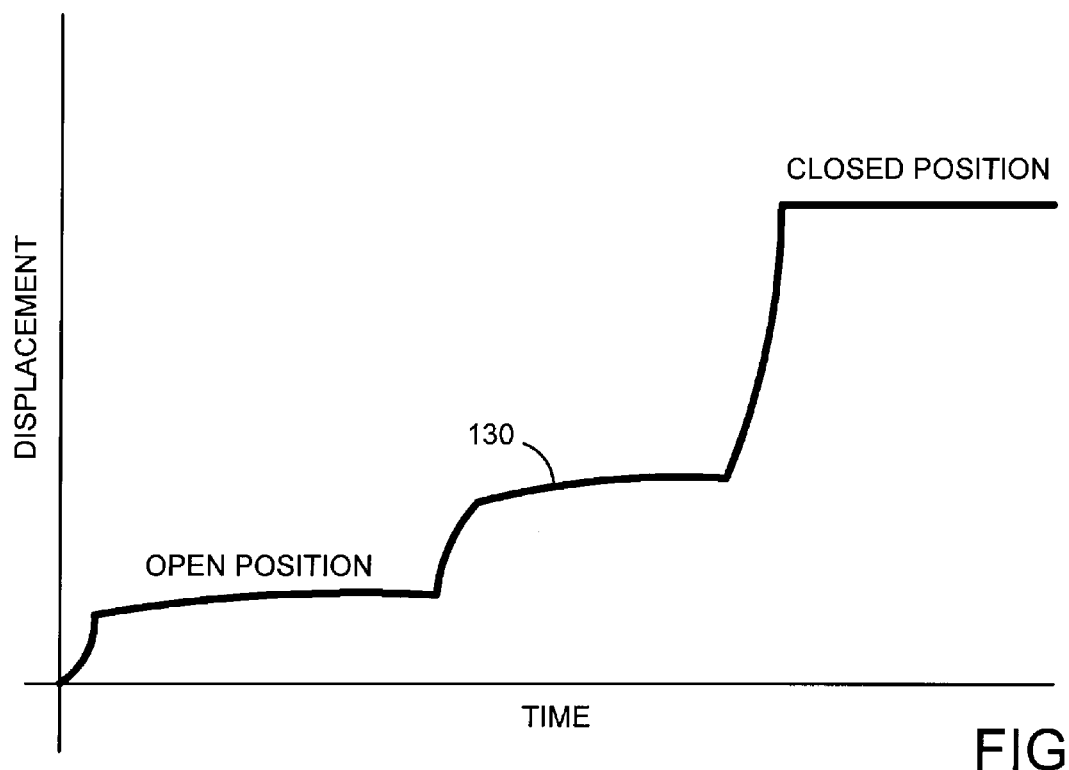
FIG. 9 graphs the displacement of a portion of the magnetic mechanical switch device over time when operated in accordance with the various embodiments of the present invention.

FIG. 9 graphs the displacement of the flexible beam 110 as a function of time with line 130 as the magnetic field varies during operation of the magnetic mechanical switch 100 in accordance with the various embodiments with the present invention. In the open position, the flexible beam 110 is only slightly displaced due to a small magnetic field being present. As current flows through one actuating conductor 104, the flexible beam 110 is further displaced, but not enough to traverse the first air gap 114 and create a low resistance state for the switch 100. Finally, as the second actuating conductor 104 is activated, the counter-clockwise field is magnified enough to induce the flexible beam 110 to traverse the first air gap 114 and couple the beam conductor 120 with the input and output sockets 116 and 118.

Figure 10:
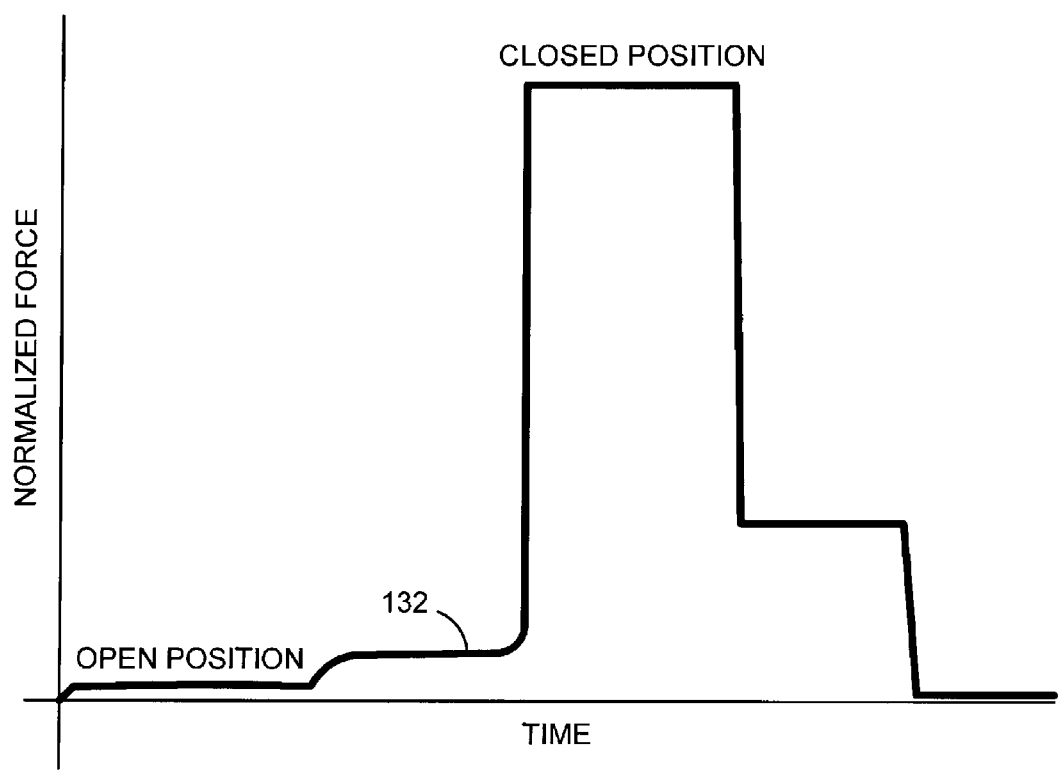
FIG. 10 graphs normalized force experienced by the magnetic mechanical switch device over time when operated in accordance with the various embodiments of the present invention.

A graph of an operational cycle of the magnetic mechanical switch 100 is graphed in FIG. 10 with line 132 as normalized force as a function of time. The force experienced by the flexible beam 110 in the open position is very small and only slightly increases as one of the actuating conductors 104 is activated. However, the substantial increase in force is shown when the second actuating conductor 104 is activated and the flexible beam 110 traverses the first air gap 114 into a closed position. The deactivation of one of the actuating conductors 104 sharply decreases the force on the flexible beam 110. Likewise, deactivation of the second actuating conductor 104 exhibits no force on the flexible beam 110.

Nevertheless, the lack of force on the flexible beam 110 does not mean that the beam will return to an open position. In fact, the hard magnet 106 will maintain the flexible beam 110 in the closed position without either actuating conductor 104 flowing power, as discussed above.

Figure 11:
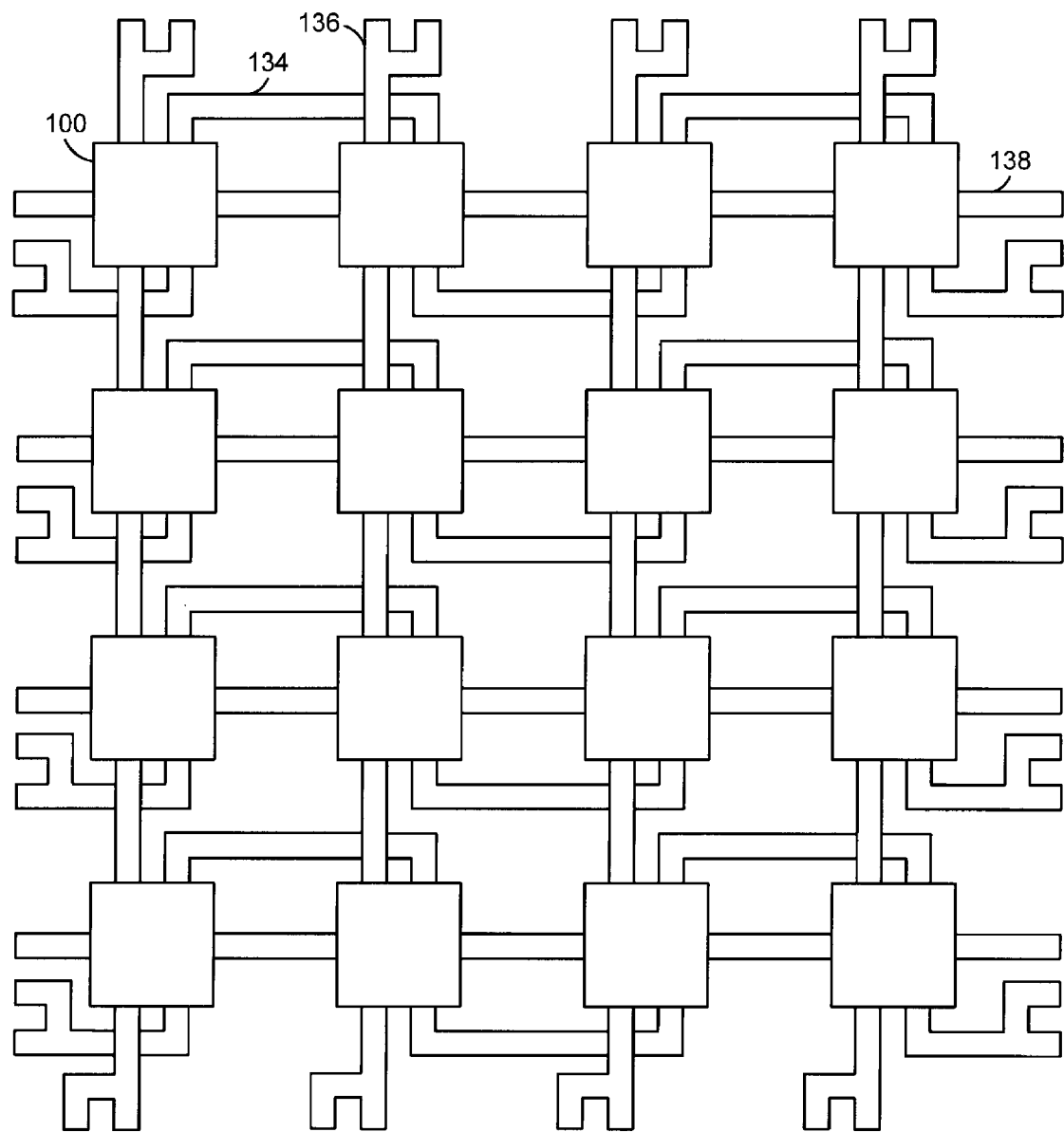
FIG. 11 generally illustrates an array of magnetic mechanical switch devices operated in accordance with various embodiments of the present invention.

FIG. 11 displays an array of magnetic mechanical switches 100 constructed and operated in accordance with the various embodiments of the present invention. A plurality of magnetic mechanical switches 100 can be configured to function together to provide large amounts of storage capacity. The actuating conductors 104 of FIGS. 1-7 can also be configured to pass through multiple main ferromagnetic cores 102 to connect a number of switches 100 is series. The actuating conductors 104 can be designated as row lines 134 and column lines 136 to designate the vertical and horizontal coordinates of a particular switch 100. Further, a socket line 138 connects to each switch 100 in a row and allows for reading of the resistance value of each switch in the row.

It can be appreciated by a skilled artisan that the column lines 136 or row lines 134 can comprise a number of individual lines that can be connected to various hosts such as, but not limited to, a multiplexer. In addition, the components of each column line 136 and row line 134 are closely aligned as they pass through each main ferromagnetic core 102 in order to provide a suitable amount of current to induce the polymeric spring 124 to traverse the first air gap 114.

In addition, the characteristics of the switch 100 have applications beyond data storage such as, but not limited to, selection of high frequency signals. A magnetic mechanical switch 100 can provide essential signal manipulation capabilities in various electronic devices. In some embodiments, the size of the magnetic mechanical switch 100 can be scaled to accommodate various electronic devices and operations. For example, memory switches are often manufactured on a nanometer scale, whereas high frequency manipulation switches operate in the micrometer regime due to differences in power requirements and packaging.

Figure 12:
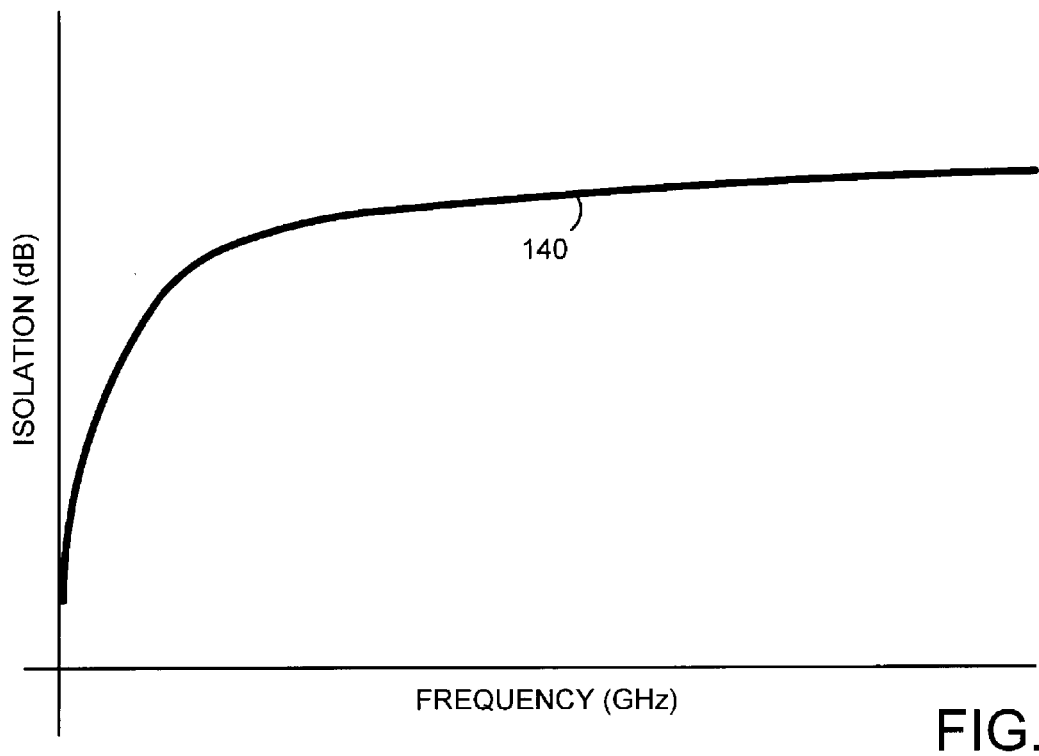
FIG. 12 displays a frequency response of a magnetic mechanical switch operated in accordance with various embodiments of the present invention.

The graph of FIG. 12 shows the isolation of a magnetic mechanical switch 100 in relation to frequency when a radio frequency (RF) or microwave resistance sensing operation is utilized in accordance with various embodiments of the present invention. The isolation line 140 is the ability of the switch to shut off power flow between the input and output sockets 116 and 118 when the switch 100 is in the high resistance position. The isolation is measured as the ratio of the power reaching the output socket 118 of the switch 100 to the power to the input socket 116.

Figure 13:
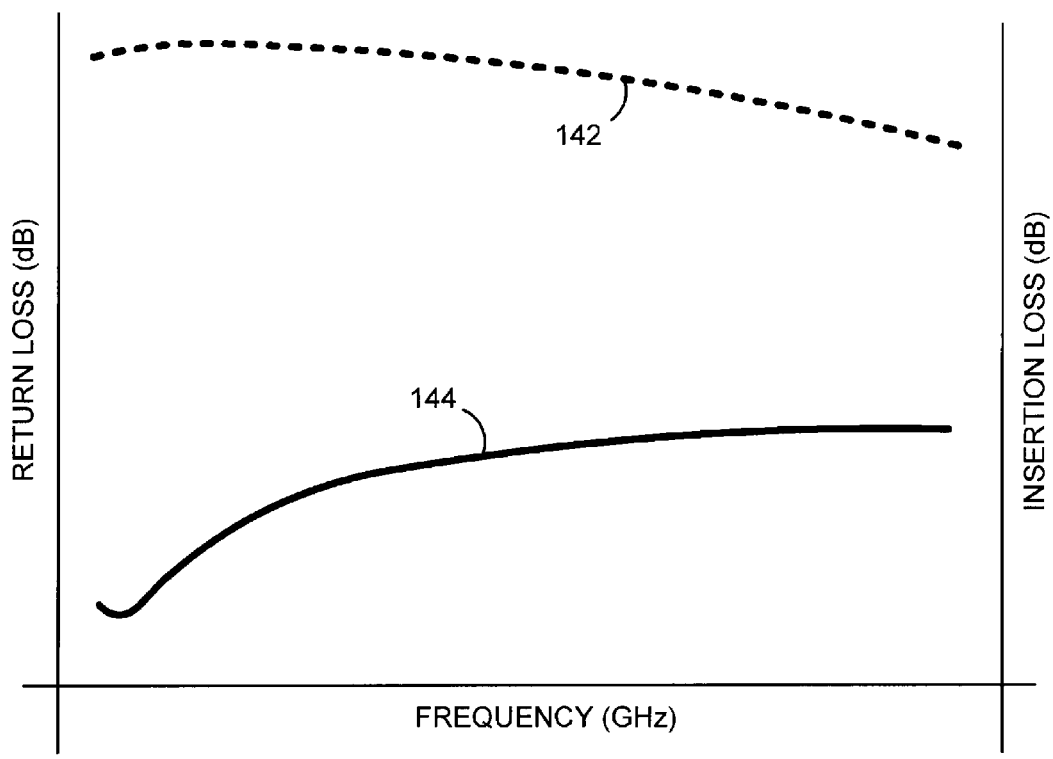
FIG. 13 graphs a frequency response of a magnetic mechanical switch operated in accordance with various embodiments of the present invention.

FIG. 13 displays the return loss and insertion loss in relation to frequency of a magnetic mechanical switch 100 when a RF or microwave resistance sensing operation is utilized in accordance with the various embodiments of the present invention. The insertion loss displayed as line 142 represents the percentage of the power at the input socket 116 reaching the output socket 118 when the switch 100 is in the low resistance position. For good switch performance, it is desired that a high percentage of the power reach the output socket 118. Thus a value of insertion loss is desired for efficient and reliable operation of the switch 100.

Return loss shown as line 144 represents the percentage of the signal reaching the input socket 116, which is reflected from the input socket with the switch 100 in the low resistance position. It is desired that a low percentage of power is reflected from the input socket 116 as this power cannot reach the output socket 118. Therefore, a high return loss value indicates an efficient and reliable switch capable of implementation in a memory array.

Figure 14:
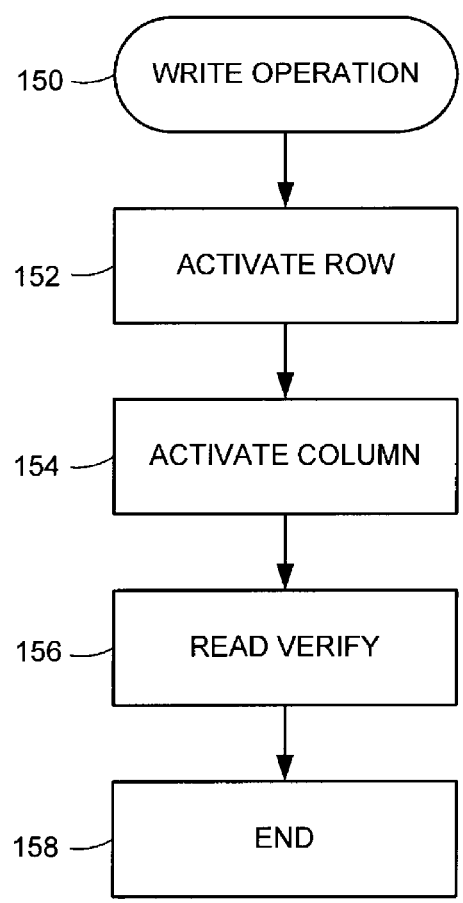
FIG. 14 shows a flow diagram of a write operation carried out in accordance with the various embodiments of the present invention.

FIG. 14 shows a write operation 150 conducted in an array of magnetic mechanical switches in accordance with the various embodiments of the present invention. The write operation 138 is initiated by passing current through a row line 134 and activating a row of switches 100 in step 152. However, the activation of a row line 134 will not provide enough magnetic force to induce a change in logical state of any of the switches 100 in the row. When a column row 136 is also activated in step 154, a column of switches 100 are activated without enough magnetic force to induce a change in logical state while a single switch 100 will have both row and columns lines 134 and 136 activated and the magnetic force experienced by the flexible beam 110 will be enough to induce a change in logical state by going from high resistance to low resistance positions. The writing of the proper logical state can be verified in step 156, but is not required for general operation of an array of switches 100. Finally, the row and column lines 134 and 136 can be deactivated in step 158 and the array will maintain the existing independent logical states of each switch 100.

Figure 15:
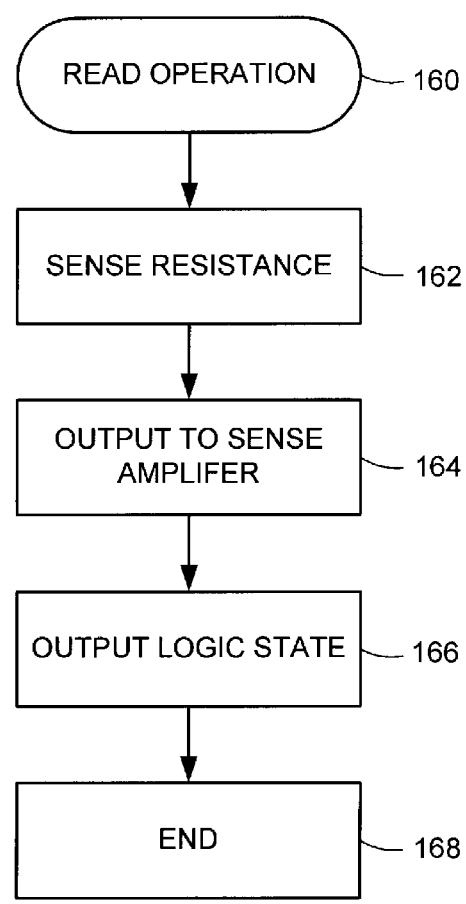
FIG. 15 displays a flow diagram of a read operation carried out in accordance with the various embodiments of the present invention.

The read operation 160 necessary to output the logical state of a magnetic mechanical switch 100 is displayed in the flow diagram of FIG. 15. The read operation 160 begins with the sensing of a resistance value for the switch 100 at step 162. In some embodiments, activation of the input socket 116 at step 164 involves a signal being sent through the socket line 138 to measure the resistance value of a single or plurality of switches. Alternatively, the actuating conductors 104 can be used to sense the resistance value of a memory cell such as the switch 122. The signal sent through the socket line 138 can include, but is not limited to, radio frequencies (RF), microwaves, or electrical power. A high resistance or low resistance value will result from the activation of a particular input socket 116 which is the product of the position of the flexible beam 110. A high resistance position will find the flexible beam 110 at a distance from the input socket 116 defined by the first air gap 114. In contrast, a low resistance position will have an electrical connection being formed from the input socket 116 to the output socket 118 through the coupling of the beam conductor 120 to each socket after the flexible beam 110 transverses the first air gap 114.

The high or low resistance value is outputted to a sense amplifier in step 166. A comparison between the output value from the switch 100 and a reference value will result in the determination of a logical state. It should be noted that the reference values can be a variety of different units such as volts or decibels depending on what signal activates the socket line 138. Furthermore, a multiplexer can be employed to distribute unique reference values to the sense amplifiers for various switches 100. The reference value can also be derived from an analysis of the switch 100 to determine the optimal value that clearly differentiates between logic states. In step 166, the logical state of the switch 100 determined by the sense amplifier is outputted to a host device. Finally, the socket and sense amplifier is deactivated in step 168.

As can be appreciated by one skilled in the art, the various embodiments illustrated herein provide advantages in both switch efficiency and complexity. The ability to use a mechanical switch with proven physical properties to toggle between a high and low resistance state provides simple and accurate logical state reading and writing. Thus, measurement of bi-stable resistances allows for more accurate and efficient reads. Moreover, the scalability of the switch provides advantageous applications in various electronic devices and operations. However, it will be appreciated that the various embodiments discussed herein have numerous potential applications and are not limited to a certain field of electronic media or type of data storage devices.

For purposes herein, the term "air gap" and the like will be understood broadly as a physical gap between the respective components, and understood by the skilled artisan, irrespective of whether atmospheric air, some other fluid (e.g. an inert gas such as helium) or even a vacuum is disposed therein. In addition, the magnetic mechanical switch 100 can be implemented in various arrangements that include, but is not limited to, memory, piezoelectric movements, and analog switches. It can be understood by the skilled artisan that the embodiments of the present invention also have applications in the movement of micro-components such as mirrors in a light projection device.

It is to be understood that even though numerous characteristics and advantages of various embodiments of the present invention have been set forth in the foregoing description, together with details of the structure and function of various embodiments of the invention, this detailed description is illustrative only, and changes may be made in detail, especially in matters of structure and arrangements of parts within the principles of the present invention to the full extent indicated by the broad general meaning of the terms in which the appended claims are expressed.

What is claimed is:

1. An apparatus comprising;
   a main ferromagnetic core at least partially surrounding at least two actuating conductors and a hard magnet, wherein the actuating conductors induce a flexible beam to traverse a first air gap defining a high resistance position and a low resistance position.

2. The apparatus of claim 1, further comprising a lower ferromagnetic core adjacent to and separated from the main ferromagnetic core by a second air gap.

3. The apparatus of claim 2, wherein the hard magnet is positioned at substantially the midpoint between the flexible beam and lower ferromagnetic core.

4. The apparatus of claim 1, wherein the two actuating conductors are positioned adjacent to opposing sides of the main ferromagnetic core.

5. The apparatus of claim 1, wherein the low resistance position connects an input socket with an output socket by coupling a conductor located on the flexible beam to each socket.

6. The apparatus of claim 1, wherein the flexible beam comprises a polymeric spring.

7. The apparatus of claim 1, wherein the actuating conductors pass through a plurality of independent main ferromagnetic cores.

8. The apparatus of claim 1, wherein activation of one actuator conductor will not induce the flexible beam to traverse the first air gap.

9. The apparatus of claim 1, wherein the flexible beam is induced to traverse the first air gap by a magnetic flux.

10. The apparatus of claim 1, wherein passing current through each actuating conductor in either of tow opposing directions induce the flexible beam to traverse the first air gap.

11. A method comprising:
    conducting current through at least two actuating conductors at least partially surrounded by a main ferromagnetic core and adjacent to a hard magnet; and
    inducing, with the actuating conductors, a flexible beam to traverse a first air gap that defines a high resistance position and a low resistance position.

12. The method of claim 11, further comprising a lower ferromagnetic core adjacent to and separated from the main ferromagnetic core by a second air gap.

13. The method of claim 12, wherein the hard magnet is positioned at substantially the midpoint between the flexible beam and lower ferromagnetic core.

14. The method of claim 11, wherein the two actuating conductors are positioned adjacent to opposing sides of the main ferromagnetic core.

15. The apparatus of claim 11, wherein the low resistance position connects an input socket with an output socket by coupling a conductor located on the flexible beam to each socket.

16. The method of claim 11, wherein the flexible beam comprises a polymeric spring.

17. The method of claim 11, wherein the actuating conductors pass through a plurality of independent main ferromagnetic cores.

18. The method of claim 11, wherein activation of one actuator conductor will not induce the flexible beam to traverse the first air gap.

19. The method of claim 11, wherein the flexible beam is induced to traverse the first air gap by a magnetic flux.

20. The method of claim 11, wherein passing current through each actuating conductor in either of tow opposing directions induce the flexible beam to traverse the first air gap.

* * * * *